(12) United States Patent
Sugo et al.

(10) Patent No.: US 8,143,106 B2
(45) Date of Patent: Mar. 27, 2012

(54) THERMOSETTING DIE-BONDING FILM

(75) Inventors: Yuki Sugo, Ibaraki (JP); Sadahito Misumi, Ibaraki (JP); Takeshi Matsumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 197 days.

(21) Appl. No.: 12/549,739

(22) Filed: Aug. 28, 2009

(65) Prior Publication Data
US 2010/0055842 A1    Mar. 4, 2010

(30) Foreign Application Priority Data

Aug. 28, 2008  (JP) ................................ 2008-219989
Jul. 3, 2009    (JP) ................................ 2009-159125

(51) Int. Cl.
*H01L 21/44* (2006.01)
(52) U.S. Cl. ........ 438/118; 438/465; 438/404; 438/464; 438/458
(58) Field of Classification Search ............. 438/118
See application file for complete search history.

(56) References Cited

U.S. PATENT DOCUMENTS

| | | | |
|---|---|---|---|
| 7,232,709 B2* | 6/2007 | Misumi et al. ............. | 438/118 |
| 7,262,514 B2* | 8/2007 | Yoshikawa et al. ........ | 257/793 |
| 7,842,551 B2* | 11/2010 | Saiki et al. ............... | 438/118 |
| 2003/0069331 A1 | 4/2003 | Teiichi et al. | |
| 2007/0026572 A1 | 2/2007 | Hatakeyama et al. | |
| 2008/0124839 A1* | 5/2008 | Saiki et al. ............... | 438/113 |
| 2010/0112272 A1 | 5/2010 | Hirano et al. | |

FOREIGN PATENT DOCUMENTS

| | | |
|---|---|---|
| JP | 60-057342 | 4/1985 |
| JP | 2004-266137 | 9/2004 |
| JP | 2006-100784 | 4/2006 |
| JP | 2007-059936 | 3/2007 |
| JP | 2008-187189 | 8/2008 |
| JP | 2008-193105 | 8/2008 |
| KR | 100723980 | 5/2007 |
| WO | WO 2008-047610 | 4/2008 |

OTHER PUBLICATIONS

Prior art search report by Korean prior art search institute issued on the corresponding Korean Patent Application No. 10-2009-0079502, dated May 3, 2010.
Office Action issued by the Korean Patent Application on Mar. 3, 2011 for the counterpart Korean Patent Application No. 10-2009-79502.
Office Action dated Aug. 30, 2011 for JP Patent Application No. 2009-159125 with English translation.

* cited by examiner

*Primary Examiner* — Benjamin Sandvik
*Assistant Examiner* — Joseph Schoenholtz
(74) *Attorney, Agent, or Firm* — Knobbe Martens Olson & Bear LLP

(57) ABSTRACT

The thermosetting die-bonding film of the present invention is used in manufacturing a semiconductor device, has at least an epoxy resin, a phenol resin, and an acrylic copolymer, and the ratio X/Y is 0.7 to 5 when X represents a total weight of the epoxy resin and the phenol resin and Y represents a weight of the acrylic copolymer.

11 Claims, 2 Drawing Sheets

THERMOSETTING DIE-BONDING FILM

This application claims priority to Japanese Patent Applications No. 2008-219989, filed Aug. 28, 2008 and No. 2009-159125, filed Jul. 3, 2009. The above-referenced applications are hereby expressly incorporated by reference in their entireties.

FIELD OF THE INVENTION

The present invention relates to a thermosetting die-bonding film that is used when fixing a semiconductor element such as a semiconductor chip onto an adherend such as a substrate and a lead frame. The present invention further relates to a dicing die-bonding film in which the thermosetting die-bonding film and a pressure-sensitive adhesive film are laminated.

BACKGROUND OF THE INVENTION

A dicing die-bonding film that adheres and holds a semiconductor wafer in a dicing step and also provides an adhesive layer for fixing a chip that is necessary in a mounting step has been conventionally used in a manufacturing process of a semiconductor device (refers to Japanese Patent Application Laid-Open No. 60-57342). This dicing die-bonding film is configured by laminating the pressure-sensitive adhesive and the adhesive layer one by one on a support base. That is, the semiconductor wafer is diced while being held by the adhesive layer, the support base is stretched, and a semiconductor chip is picked up together with the die-bonding film. Furthermore, the semiconductor chip is die-bonded onto a die pad of the lead frame with the die-bonding film interposed therebetween.

However, as the size of a semiconductor wafer becomes larger and the thickness of a semiconductor wafer becomes thinner in recent years, there is a case that a semiconductor chip is adhered in a warped state when die bonding. In such case, a sufficient pressure is not applied to the peripheral part of the semiconductor chip, and as a result, very small gas bubbles (micro voids) having a diameter of about 10 to 100 μm may be generated. Caused by this micro void, a local sink (a hollow) may be generated in the peripheral part of the semiconductor chip. As a result, a decrease of the yield of manufacturing a semiconductor device is brought about by the existence of this micro void and local sink. That is, the micro void, etc. cause peeling in a humidity resistance solder reflow test that is used in the reliability evaluation of semiconductor related parts, for example, and a deterioration of the reliability is brought about. Further, the mold resin enters into the peripheral part of the semiconductor chip where micro voids etc. exist when resin molding, which thus causes the semiconductor chip to be damaged.

SUMMARY OF THE INVENTION

The present invention was performed in view of the above-described problem points, and an object is to provide a thermosetting die-bonding film that suppresses the generation of micro voids and local sinks in the peripheral part of the semiconductor chip when a semiconductor element is die-bonded onto an adherend, and as a result, can improve the manufacturing yield of a semiconductor device.

The present inventors investigated a thermosetting die-bonding film to solve the conventional problems. As a result, they found that adhesion can be improved even in the peripheral part of the semiconductor chip when the semiconductor chip is die-bonded onto an adherend by making the blending amount of an epoxy resin and a phenol resin that are constituting materials of the thermosetting die-bonding film large as compared to the conventional blending amount, and came to the completion of the present invention.

That is, the present invention relates to a thermosetting die-bonding film that is used in manufacturing a semiconductor device, comprising at least an epoxy resin, a phenol resin, and an acrylic copolymer, wherein the ratio X/Y is 0.7 to 5 when X represents a total weight of the epoxy resin and the phenol resin and Y represents a weight of the acrylic copolymer.

As in the above-described configuration, by making the total weight of the epoxy resin and the phenol resin larger than the weight of the acrylic copolymer, a thermosetting die-bonding film that can be fixed on the adherend in a liquid state can be obtained. Accordingly, the die bonding can be performed with an improved adhesion in the peripheral part of the semiconductor element even when die bonding a semiconductor element such as a large and thin semiconductor chip, for example. As a result, the generation of very small gas bubbles (micro voids) and local sinks (hollows) can be reduced. Accordingly, peeling of the thermosetting die-bonding film can be prevented from occurring even in a humidity resistance solder reflow test that is used to evaluate the reliability of semiconductor related parts, and the reliability can be improved. Also, during resin molding, the mold resin is prevented from entering into the peripheral part of the semiconductor element, and damage to the semiconductor element can be prevented.

In the thermosetting die-bonding film, it is preferable that the melt viscosity of the epoxy resin at 120 to 130° C. is in the range of 0.05 to 7 Pa·s. Furthermore, in the thermosetting die-bonding film, it is preferable that the melt viscosity of the phenol resin at 120 to 130° C. is in the range of 0.3 to 35 Pa·s.

In the thermosetting die-bonding film, it is preferable that the acrylic copolymer comprises 10 to 60% by weight of butyl acrylate and 40 to 90% by weight of ethyl acrylate.

Furthermore, in the thermosetting die-bonding film, it is preferable that the melt viscosity at 120 to 130° C. is in the range of 500 to 3500 Pa·s. Accordingly, even when performing wire bonding to the semiconductor element that is fixed onto the thermosetting die-bonding film for example, it can be prevented that shearing deformation occurs at the adhesion surface of the die-bonding film with the adherend due to ultrasonic vibration and heating. As a result, the success rate of the wire bond can be increased, and a semiconductor device can be manufactured with a further improved yield.

Furthermore, in the thermosetting die-bonding film, it is preferable that the glass transition point of the acrylic copolymer is in the range of −30 to 30° C. Accordingly, the semiconductor element is prevented from inclining in the sealing step, for example, and peeling between the die-bonding film and the adherend can be prevented from occurring during the solder reflow step.

In order to solve the above-mentioned problems, the present invention relates to a dicing die-bonding film having a structure in which the thermosetting die-bonding film is laminated on a dicing film.

In the semiconductor device, it is preferable that very small gas bubbles and local sinks (hollows) do not exist in the peripheral part of the semiconductor chip that is die bonded on the adherend. When a semiconductor device is manufactured using the dicing die-bonding film of the present invention, because the generation of very small gas bubbles and local sinks (hollows) can be reduced, damage to the semiconductor element can be prevented and improvement of the throughput can be attempted.

The present invention has an effect described below with the above-explained means.

That is, according to the present invention, when the thermosetting die-bonding film contains an epoxy resin, a phenol resin, and an acrylic copolymer, and a ratio X/Y is set to 0.7 to 5 in the case where the total weight of the epoxy resin and the phenol resin is assumed to be X, and the weight of the acrylic copolymer is assumed to be Y, the generation of very small gas bubbles (micro voids) and local sinks (hollows) can be reduced in the peripheral part of a large and thin semiconductor element that is die bonded onto the adherend. As a result, durability in the humidity resistance solder reflow test is improved, and during resin molding, the mold resin is prevented from entering into the peripheral part of the semiconductor element, and damage to the semiconductor element can be prevented.

DESCRIPTION OF THE EMBODIMENTS

Figure 1:
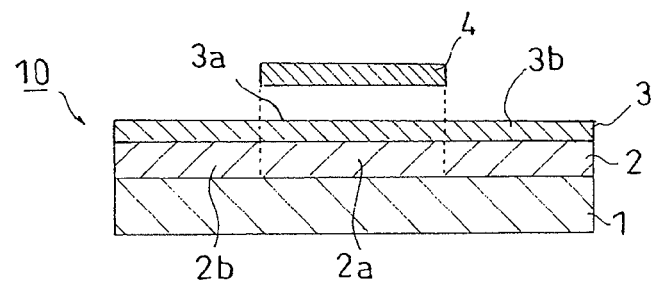
FIG. 1 is a schematic sectional view showing a dicing die-bonding film of one embodiment of the present invention.

The thermosetting die-bonding film of the present invention (referred to as "a die-bonding film" below) is explained below using an embodiment in which the thermosetting die-bonding film is laminated on a dicing film that is formed by laminating a pressure-sensitive adhesive layer 2 onto a base 1 as shown in FIG. 1 as an example.

A die-bonding film 3, 3' of the present invention is constituted by containing at least an epoxy resin, a phenol resin, and an acrylic copolymer. When the total weight of the epoxy resin and the phenol resin is assumed to be X and the weight of the acrylic copolymer is assumed to be Y, a ratio X/Y is in the range of 0.7 to 5, preferably 0.8 to 4, and more preferably 1 to 3. By making X/Y is in this range, the epoxy resin and the phenol resin that acts as a curing agent of the epoxy resin are contained in an amount more than the acrylic copolymer. Accordingly, the melt viscosity can be decreased, and the wettability with the adherend can be improved. As a result, the melt viscosity of the die-bonding film 3, 3' at 120 to 130°

C. can be set to 3500 Pa·s or less, and the generation of very small gas bubbles (micro voids) and local sinks (hollows) in the peripheral part of a semiconductor chip (a semiconductor element) that is die bonded onto the adherend can be reduced. When X/Y is larger than 5, there is a case that a disadvantage occurs that it is difficult to process the die-bonding film 3, 3' into a film.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on. The epoxy resin has few ionic impurities, etc. that corrode the semiconductor element.

The phenol resin acts as a curing agent of the epoxy resin, and examples include novolak phenol resins such as a phenol novolak resin, a phenol aralkyl resin, a cresol novolak resin, a tert-butylphenol novolak resin, and a nonylphenol novolak resin, resol phenol resins, and polyoxystryrene such as polyparaoxystyrene. These can be used alone or two types or more can be used in combination. Among these phenol resins, a biphenyl phenol novolak resin and a phenol aralkyl resin are preferable because they can improve connection reliability of the semiconductor device.

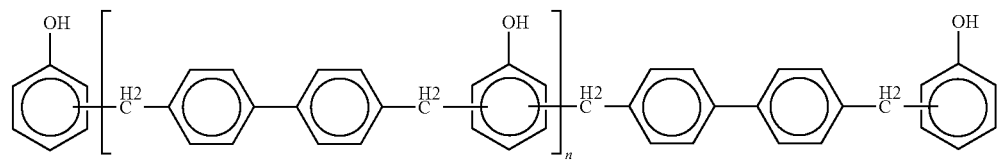

(In the formula, n is a natural number of 0 to 10.)

The value of n is preferably a natural number of 0 to 10, and more preferably a natural number of 0 to 5. By setting n in this range, fluidity of the die-bonding film 3, 3' can be secured.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

The monomer component that is used in the acrylic copolymer is not particularly limited, and examples include butyl acrylate and ethyl acrylate. A copolymer comprised butyl acrylate within the range of 10 to 60% by weight and ethyl acrylate within the range of 40 to 90% by weight with respect to the entire monomer component is preferable as the acrylic copolymer of the present invention.

Other monomer components that can copolymerize with the above-described monomer components are not particularly limited, and examples include acrylonitrile. The used amount of these copolymerizable monomer components is preferably in the range of 1 to 20% by weight with respect to the entire monomer component. By including other monomer components in this range, cohesive strength, tackiness, etc. can be modified.

The polymerization method of the acrylic copolymer is not particularly limited, and a conventionally known method can be adopted such as solution polymerization, bulk polymerization, and suspension polymerization, and emulsion polymerization.

The glass transition point ($T_g$) of the acrylic copolymer is preferably −30 to 30° C., and more preferably −20 to 15° C. By setting the glass transition point to −30° C. or more, heat resistance can be secured. On the other hand, by setting it to 30° C. or less, the effect of preventing chip fly after dicing for a wafer having a rough surface is improved.

The weight average molecular weight of the acrylic copolymer is preferably 100,000 or more, and more preferably 600,000 to 1,200,000, and particularly preferably 700,000 to 1,000,000. By setting the weight average molecular weight to 100,000 or more, excellent tackiness of a wiring substrate, etc. to the surface of the adherend at high temperature can be obtained, and the heat resistance can be improved. By setting the weight average molecular weight to 1,200,000 or less, the acrylic copolymer can be easily dissolved into an organic solvent. The weight average molecular weight is a polystyrene conversion value calculated using a calibration curve of a polystyrene standard with gel permeation chromatography (GPC).

Examples of the filler include an inorganic filler and an organic filler. An inorganic filler is preferable from the viewpoints of improving handling and thermal conductivity, adjusting the melt viscosity, and imparting a thicotropic property.

The inorganic filler is not particularly limited, and examples include silica, aluminum hydroxide, calcium hydroxide, magnesium hydroxide, antimony trioxide, calcium carbonate, magnesium carbonate, calcium silicate, magnesium silicate, calcium oxide, magnesium oxide, aluminum oxide, aluminum nitride, aluminum borate, boron nitride, crystalline silica, and amorphous silica. These can be used alone, and two types or more can be used in combination. From the viewpoint of improving the thermal conductivity, aluminum oxide, aluminum nitride, boron nitride, crystalline silica, amorphous silica, etc. are preferable. From the viewpoint of balance with the tackiness of the die-bonding film 3, silica is preferable. Examples of the organic filler include polyimide, polyamideimide, polyetheretherketone, polyetherimide, polyesterimide, nylon, and silicone. These can be used alone or two types or more can be used in combination.

The average particle size of the filler is preferably 0.005 to 10 μm, and more preferably 0.05 to 1 μm. When the average particle size of the filler is 0.005 μm or more, good wettability to the adherend can be obtained, and a deterioration of the tackiness can be suppressed. On the other hand, by setting the average particle size to 10 μm or less, the reinforcing effect to the die-bonding film 3 due to the addition of the filler is improved, and the heat resistance can be improved. Fillers having a different average particle size to each other may be combined and used. The average particle size of the filler is a value obtained with a luminous intensity type particle size distribution meter (trade name "LA-910" manufactured by HORIBA, Ltd.).

The content of the filler is preferably 0 part by weight to 80 parts by weight, and more preferably 0 part by weight to 70 parts by weight with respect to the total 100 parts by weight of the epoxy resin, the phenol resin, and the acrylic copolymer. When the content of the filler is 0 part by weight, there is no reinforcing effect due to the addition of the filler, and the heat resistance of the die-bonding film 3 tends to deteriorate. On the other hand, when the content exceeds 80 parts by weight, the wettability to the adherend decreases, and the tackiness tends to decrease.

The shape of the filler is not particularly limited, and for example, a sphere shape and an oval shape can be used.

Other additives can be appropriately compounded in the die-bonding film 3 depending on necessity. Examples of the other additives include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

The thermosetting accelerating catalyst of the epoxy resin and the phenol resin is not particularly limited, and is preferably a salt made of any one of a triphenylphosphine skeleton, an amine skeleton, a triphenylborane skeleton, and a trihalogenborane skeleton for example.

The melt viscosity of the die-bonding film 3 at 120 to 130° C. is preferably 500 to 3500 Pa·s, more preferably 500 to 3300 Pa·s, and particularly preferably 500 to 3000 Pa·s. By setting the melt viscosity in this range, the generation of very small gas bubbles (micro voids) and local sinks (hollows) in the peripheral part of the semiconductor element that is die bonded onto the adherend can be reduced. As a result, peeling of the die-bonding film 3 and damage to the semiconductor element in the humidity resistance solder reflow test are prevented, and a highly reliable semiconductor device can be manufactured.

The storage modulus of the die-bonding film 3 at 260° C. after thermosetting is preferably 0.5 MPa or more, more preferably 0.5 to 100 MPa, and particularly preferably 0.5 to 50 MPa. By setting the storage modulus to 0.5 MPa or more, a highly reliable semiconductor device can be manufactured even in the humidity resistance solder reflow test, etc.

The thickness (the total thickness as a laminated body) of the die-bonding film 3 is not particularly limited. However, it is about 5 to 100 μm, and preferably about 5 to 50 μm.

The die-bonding film can be configured only as a single layer of the adhesive layer, for example. It may have a multilayer structure of two layers or more by appropriately combining thermoplastic resins having different glass transition temperatures and thermosetting resins having different thermosetting temperatures. Since a cutting liquid is used in the dicing step of a semiconductor wafer, the die-bonding film absorbs moisture, and there is a case that the water content becomes a normal state or more. When the die-bonding film is adhered to a substrate, etc. with such high water content, water vapor stays on the adhesion interface at the stage after curing, and there is a case that floating occurs. Therefore, the die-bonding film have a structure in which a core material having high moisture permeability is sandwiched between the adhesive layer, which thus makes it possible to avoid such a problem by diffusing the water vapor through the film at the stage after curing. From such a viewpoint, the die-bonding film may have a multi-layer structure in which the adhesive layer is formed on one side or both sides of the core material.

Examples of the core material include a film such as a polyimide film, a polyester film, a polyethylene terephthalate film, a polyethylene naphthalate, and a polycarbonate film, a resin substrate reinforced by a glass fiber or a plastic non-woven fiber, a mirror wafer, a silicon substrate, and a glass substrate.

The die-bonding film 3 is preferably protected by a separator (not shown in the drawings). The separator has a function as a protecting material of protecting the die-bonding film until it is put into a practical use. Further, the separator can be used as a support base when transferring the die-bonding film 3 to the dicing film. The separator is peeled off when pasting the workpiece onto the die-bonding film. Polyethylene terephthalate (PET), polyethylene, polypropylene, a plastic film whose surface is coated with a peeling agent such as a fluorine peeling agent and a long chain alkyl acrylate peeling agent, a paper, etc. can be used as the separator.

Figure 2:
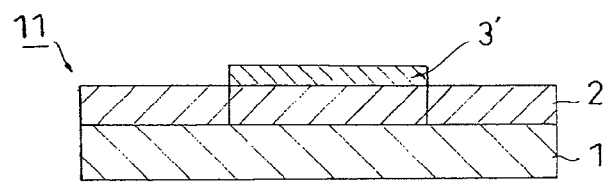
FIG. 2 is a schematic sectional view showing a dicing die-bonding film of another embodiment of the present invention.

An example of the dicing film is a film in which the pressure-sensitive adhesive layer 2 is laminated on the base 1. The die-bonding film 3 is laminated on the pressure-sensitive adhesive layer 2. As shown in FIG. 2, the dicing film may have a configuration in which the die-bonding film 3' is formed only on a semiconductor wafer pasting portion.

The base 1 becomes a strength base of the dicing die-bonding film 10, 11. Examples include polyolefins such as low-density polyethylene, straight-chain polyethylene, medium-density polyethylene, high-density polyethylene, super low-density polyethylene, random-copolymerized polyethylene, block-copolymerized polyethylene, homo-polyethylene, polybutene, and polymethylpentene, an ethylene-vinylacetate copolymer, an ionomer resin, an ethylene-(meth)acrylate copolymer, an ethylene-(meth)acrylic ester (random, alternating) copolymer, an ethylene-butene copolymer, an ethylene-hexene copolymer, polyurethane, polyester such as polyethylene terephthalate and polyethylene naphthalate, polycarbonate, polyimide, polyetheretherketone, polyetherimide, polyamide, wholly aromatic polyamide, polyphenylsulfide, aramid (paper), glass, glass cloth, a fluorine resin, polyvinyl chloride, polyvinylidene chloride, a cellulose resin, a silicone resin, metal (foil), and a paper. When the pressure-sensitive adhesive layer 2 is an ultraviolet ray curing type, a material that permits ultraviolet ray to pass through is preferable as the base 1.

An example of the material of the base 1 is a polymer such as a crosslinked body of the above-described resins. The above-described plastic film may be used in a non-stretched state, or a film may be used on which a mono-axial or a biaxial stretching treatment is performed depending on necessity. With a resin sheet in which a heat shrinking property is given by the stretching treatment, etc., recovery of the semiconductor chip can be easily attempted by reducing the adhesion area of the pressure-sensitive adhesive layer 2 with the die-bonding film 3,3' by heat-shrinking the base 1 after dicing.

The surface of the base 1 can be treated with a traditional surface treatment such as a chemical or a physical treatment such as a chromic acid treatment, an ozone exposure, a flame exposure, a high-voltage electric-shock exposure, and an ionized radiation treatment, and a coating treatment with a primer such as pressure-sensitive adhesive materials described later.

The same types or different types of the materials can be appropriately selected and used as the base 1, and several types can be blended and used depending on necessity. Further, an evaporation layer of a conductive material having a thickness of about 30 to 500 angstroms made of metals, alloys, or oxides of these, etc. can be provided on the base 1 to give an antistatic property. The base 1 may be a single layer or a multi-layer of two types or more.

The thickness of the base 1 is not particularly limited and is appropriately determined. However, it is generally about 5 to 200 μm.

The base 1 may contain various additives such as a coloring agent, a filler, a plasticizer, an anti-aging agent, an antioxidant, a surfactant, and a flame retardant in a range that does not spoil the effects, etc. of the present invention.

The pressure-sensitive adhesive layer 2 is configured by including an ultraviolet ray curing-type pressure sensitive adhesive. The ultraviolet ray curing-type pressure-sensitive adhesive can easily deteriorate the adhesive strength by increasing the degree of crosslinking by the irradiation of ultraviolet ray, and by irradiating only a portion 2a corresponding to the semiconductor wafer pasting portion of the pressure-sensitive adhesive layer 2 shown in FIG. 2 with the ultraviolet ray, a difference of adhesive strength with the other portion 2b can be provided.

By curing the ultraviolet ray curing-type pressure-sensitive adhesive layer 2 matching with the die-bonding film 3' shown in FIG. 2, the portion 2a can be easily formed having an extremely low adhesive strength. Since the die-bonding film 3' is pasted to the portion 2a that is cured and having a lowered adhesive strength, the interface between the portion 2a of the pressure-sensitive adhesive layer 2 and the die-bonding film 3' has a characteristic of easily peeling off during pickup. On the other hand, the portion that is not irradiated with the ultraviolet ray has a sufficient adhesive strength and forms the portion 2b.

As described above, the portion 2b formed with the non-cured ultraviolet ray curing-type pressure-sensitive adhesive in the pressure-sensitive adhesive layer 2 of the dicing die-bonding film 10 shown in FIG. 1 adheres to the die-bonding film 3, and the holding strength when dicing can be secured. In such way, the ultraviolet ray curing-type pressure-sensitive adhesive can support the die-bonding film 3 for fixing the semiconductor chip to the adherend such as a substrate with a good balance of adhesion and peeling. In the pressure-sensitive adhesive layer 2 of the dicing die-bonding film 11 shown in FIG. 2, the portion 2b can fix a wafer ring 16. The adherend 6 is not particularly limited, and examples include various substrates such as a BGA substrate, a lead frame, a semiconductor element, and a spacer.

An ultraviolet ray curing-type pressure-sensitive adhesive having an ultraviolet curable functional group such as a carbon-carbon double bond and showing adhesion can be used as the ultraviolet ray curing-type pressure-sensitive adhesive without particular limitation. An example of the ultraviolet ray curing-type pressure-sensitive adhesive is an addition-type ultraviolet ray curing-type pressure-sensitive adhesive in which ultraviolet ray curable monomer component and oligomer component are compounded into a general pressure-sensitive adhesive such as an acrylic pressure-sensitive adhesive and a rubber pressure-sensitive adhesive.

The pressure-sensitive adhesive is preferably an acrylic pressure-sensitive adhesive having an acrylic polymer as a base polymer from the respect such as the cleaning property of electronic parts that dislike contamination such as a semiconductor wafer and a glass when cleaned with an organic solvent such as super pure water and alcohol.

An example of the acrylic polymer is an acrylic polymer made of a monomer composition containing acrylic ester and a monomer containing a hydroxyl group. However, the acrylic polymer does not preferably contain a monomer containing a carboxyl group.

A monomer represented by a chemical formula $CH_2=CHCOOR$ (in the formula, R is an alkyl group having 6 to 10 carbon atoms and more preferably having 8 to 9 carbon atoms) is preferably used as the acrylic ester. When the number of carbon atoms is less than 6, the peeling strength becomes too large, and there is a case that the pickup property deteriorates. On the other hand, when the number of carbon atoms exceeds 10, tackiness or adhesion with the die-bonding film decreases, and as a result, there is a case that chip fly occurs when dicing.

Examples of the monomer represented by the chemical formula include hexyl acrylate, heptyl acrylate, octyl acrylate, isooctyl acrylate, 2-ethylhexyl acrylate, nonyl acrylate, isononyl acrylate, decyl acrylate, and isodecyl acrylate. Among these monomers, a monomer of which R in the alkyl group has 8 to 9 carbon atoms is preferable, and specifically 2-ethylhexyl acrylate and isooctyl acrylate are preferable. These monomers can be used alone or two types or more are combined and used.

The content of the acrylic ester is preferably 50 to 99% by weight and more preferably 70 to 90% by weight with respect to the entire monomer component. When the content is less than 50% by weight, the peeling strength becomes too large, and there is a case that the pickup property deteriorates. However, when the content exceeds 99% by weight, the adherability deteriorates, and there is a case that chip fly occurs when dicing.

The acrylic polymer may contain acrylic ester other than the monomer represented by the above-described chemical formula as a monomer component. Examples of such acrylic ester include an acrylic ester having an aromatic ring (for example, acrylic allylesters such as phenyl acrylate) and an acrylic ester having an alicyclic hydrocarbon group (for example, cycloalkylester acrylate such as cyclopentyl acrylate, and cyclohexyl acrylate, isobornyl acrylate, etc.) Among these monomer components, acrylic alkyl ester and cycloalkylester acrylate are preferable, and acrylic alkyl ester is particularly preferable. These acrylic esters can be used alone or two types or more can be combined and used.

Examples of the acrylic alkyl ester other than the monomer represented with the above-described chemical formula include acrylic alkyl ester having an alkyl group having 5 or fewer carbon atoms such as methyl acrylate, ethyl acrylate, propyl acrylate, isopropyl acrylate, butyl acrylate, isobutyl acrylate, s-butyl acrylate, t-butyl acrylate, pentyl acrylate, and isopentyl acrylate; and examples also include acrylic alkyl ester having an alkyl group having 11 or more carbon atoms (preferably 11 to 30) such as undecyl acrylate, dodecyl acrylate, tridecyl acrylate, tetradecyl acrylate, hexadecyl acrylate, octadecyl acrylate, and eicosyl acrylate.

The acrylic alkyl ester such as the monomer represented by the above-described chemical formula may be any form of a straight chain and a branched chain acrylic alkyl ester.

A monomer containing a hydroxyl group that is capable of copolymerizing with the acrylic ester is used in the acrylic polymer as an essential component. Examples of the monomer containing a hydroxyl group include 2-hydroxyethyl (meth)acrylate, 2-hydroxypropyl(meth)acrylate, 4-hydroxybutyl(meth)acrylate, 6-hydroxyhexyl(meth)acrylate, 8-hydorxyoctyl(meth)acrylate, 10-hydroxydecyl(meth)acrylate, 12-hydroxylauryl(meth)acrylate, and (4-hydroxymethylcyclohexyl)methyl(meth)acrylate. These monomers can be used alone or two types or more can be combined and used.

The content of the monomer containing a hydroxyl group is preferably in the range of 1 to 30% by weight, and more preferably in the range of 3 to 10% by weight with respect to the entire monomer component. When the content is less than 1% by weight, the cohesive strength of the pressure-sensitive adhesive decreases, and there is a case that the pickup property deteriorates. On the other hand, when the content exceeds 30% by weight, peeling becomes difficult because the polarity of the pressure-sensitive adhesive becomes high and the interaction with the die-bonding film becomes large.

The acrylic polymer may include a unit corresponding to another monomer component that is capable of copolymerizing with the acrylic ester or the monomer containing a hydroxyl group depending on necessity for the purpose of improving cohesive strength and heat resistance. Examples of such other monomer include methacrylic ester such as methyl methacrylate, ethyl methacrylate, propyl methacylate, isopropyl methacrylate, butyl methacrylate, isobutyl methacrylate, s-butyl methacrylate, and t-butyl methacrylate; anhydride monomers such as maleic anhydride and itaconic anhydride; monomers containing a sulfonic acid group such as styrene sulfonate, allylsulfonate, 2-(meth)acrylamide-2-methylpropane sulfonate, (meth)acrylamidepropane sulfonate, sulfopropyl(meth)acrylate, and (meth)acryloyloxynaphtalene sulfonate; monomers containing a phosphate group such as 2-hydroxyethylacryloylphosphate; styrene monomers such as styrene, vinyl toluene, α-methylstyrene; olefins or dienes such as ethylene, butadiene, isoprene, and isobutylene; monomers containing a halogen atom such as vinylchloride; monomers containing a fluorine atom such as fluorine(meth)acrylate; acrylamide; and acrylnitrile.

The acrylic polymer preferably does not include the monomer containing a carboxyl group as described above. This is because the tackiness of the pressure-sensitive adhesive layer 2 and the die-bonding film 3 becomes large due to the carboxyl group reacting with the epoxy group of the epoxy resin in the die-bonding film 3 and the peeling property of both deteriorates when the monomer containing a carboxyl group is included. Examples of such monomer containing a carboxyl group include acrylic acid, methacrylic acid, carboxyethyl(meth)acrylate, carboxypentyl(meth)acrylate, itaconic acid, maleic acid, fumaric acid, and crotonic acid.

The acrylic polymer can be obtained by polymerizing a single monomer or a mixture of two types or more monomers. The polymerization can be performed with any known method such as solution polymerization (for example, radical polymerization, anion polymerization, cation polymerization, etc.), emulsion polymerization, bulk polymerization, suspension polymerization, and photopolymerization (for example, ultraviolet ray (UV) polymerization). The content of low molecular weight material is preferably small from the respect of minimizing the contamination of a clean adherend. From this respect, the number average molecular weight of the acrylic polymer is preferably 350,000 to 1,000,000, and more preferably about 450,000 to 800,000.

An external crosslinking agent can be suitably adopted in the pressure-sensitive adhesive to increase the number average molecular weight of the acrylic polymer that is a base polymer, etc. As a specific method of external crosslinking, an example thereof includes a method of adding and reacting a so-called crosslinking agent such as a polyisocyanate compound, an epoxy compound, an aziridine compound, and a melamine-based crosslinking agent. In the case of using an external crosslinking agent, its used amount is appropriately determined by a balance with the base polymer that has to be crosslinked and further by the usage as a pressure-sensitive adhesive. In general, it is about 5 parts by weight or less with respect to 100 parts by weight of the base polymer, and further, it is preferably compounded at 0.1 to 5 parts by weight. Various conventionally known additives such as a tackifier and an anti-aging agent may be used in the pressure-sensitive adhesive depending on necessity other than the above-described components.

Examples of the ultraviolet ray curable monomer component that is compounded include a urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, and 1,4-butanediol di(meth)acrylate. Examples of the ultraviolet ray curable oligomer component include various oligomers of a urethane type, a polyether type, a polyester type, a polycarbonate type, a polybutadiene type, etc, and its molecular weight is appropriately in the range of about 100 to 30,000. The blending amount of the ultraviolet ray curable monomer components and oligomer components can be appropriately determined so that it is an amount in which the adhesive strength of the pressure-sensitive adhesive layer can be decreased depending on the type of the pressure-sensitive adhesive layer. Generally, it is 5 to 500 parts by weight, for example, and preferably about 40 to 150 parts by weight with respect to 100 parts by weight of the base polymer constituting the pressure-sensitive adhesive.

An example of the ultraviolet ray curing-type pressure-sensitive adhesive is an internal-type ultraviolet ray curing-type adhesive that uses a base polymer having a carbon-carbon double bond in a polymer side chain or a main chain or the ends of the main chain other than the addition-type ultraviolet ray curing-type pressure-sensitive adhesive that is explained above. Since the internal-type ultraviolet ray curing-type adhesive does not necessarily include or does not mostly include an oligomer component, etc. that is a low molecular weight component, the oligomer component, etc. does not travel in the pressure-sensitive adhesive with time, and a pressure-sensitive adhesive layer having a stable layer structure can be formed, and therefore it is preferable.

A base polymer having a carbon-carbon double bond and having adhesion can be used without limitation. For such a base polymer, a polymer having an acrylic polymer as a basic skeleton is preferable. An example of the base skeleton of the acrylic polymer is the acrylic polymer exemplified above.

The method of introducing the carbon-carbon double bond to the acrylic polymer is not particularly limited, and various methods can be adopted. However, it is easy to introduce the carbon-carbon double bond to the polymer side chain from the respect of molecular design. An example is a method of copolymerizing a monomer having a functional group to an acrylic polymer in advance and performing a condensation or an addition reaction on a compound having a functional group and a carbon-carbon double bond that reacts with this functional group while maintaining the ultraviolet ray curing property of the carbon-carbon double bond.

Examples of a combination of these functional groups include a carboxylic acid group and an epoxy group, a carboxylic acid group and an aziridyl group, and a hydroxyl group and an isocyanate group. Among these combinations of functional groups, the combination of a hydroxyl group and an isocyanate group is preferable due to the ease of tracing the reaction. In these combinations of functional groups, the functional groups may be in any side of the acrylic polymer and the above-described compounds as long as they are a combination that produces an acrylic polymer having a carbon-carbon double bond. However, in the above preferred combinations, the case that the acrylic polymer has the hydroxyl group and the above-described compound has the isocyanate group is preferable. In this case, examples of the isocyanate compound having a carbon-carbon double bond include mathacryloyl isocyanate, 2-methacryloyloxyethyl isocyanate, and m-isopropenyl-α,α-dimethylbenzyl isocyanate. An acrylic polymer in which ether compounds such as the monomers containing a hydroxy group exemplified above, 2-hydroxyethylvinyl ether, 4-hydroxybityl ether, and diethylene glycol monovinyl ether are copolymerized is used as the acrylic polymer.

In the internal type ultraviolet ray curing-type pressure-sensitive adhesive, the base polymer having a carbon-carbon double bond (particularly an acrylic polymer) can be used alone. However, the ultraviolet ray curable monomer component and oligomer component can also be compounded at a level that the characteristics are not deteriorated. The ultraviolet ray curable oligomer component, etc. can be compounded normally in the range of 0 to 30 parts by weight, and preferably in the range of 0 to 10 parts by weight with respect to 100 parts by weight of the base polymer.

A photopolymerization initiator is contained in the ultraviolet ray curing-type pressure-sensitive adhesive when it is cured by the ultraviolet ray, etc. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexylphenylketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, beozoin isopropyl ether, and anisoin methyl ether; ketal compounds such as benzyl dimethyl ketal; aromatic sulfonyl chloride compounds such as 2-naphthalene sulfonyl chloride; photoactivated oxime compounds such as 1-phenone-1,1-propanedione-2-(o-ethoxycarbonyl)oxime; benzophenone compounds such as benzophenone, benzoylbenzoic acid, and 3,3'-dimethl-4-methoxybenzophenone; thioxanthone compounds such as thioxanthone, 2-chlorothioxanthone, 2-methylthioxanthone, 2,4-dimethylthioxanthone, isopropyl thioxanthone, 2,4-dichlorothioxanthone, 2,4-diethylthioxanthone, and 2,4-diisopropylthioxanthone; camphorquinone; ketone halide; acylphosphinoxide; and acrylphosphonate. The blending amount of the photopolymerization initiator is, for example, about 0.05 to 20 parts by weight with respect to 100 parts by weight of the base polymer such as the acrylic polymer constituting the pressure-sensitive adhesive.

Example of the ultraviolet ray curing-type pressure-sensitive adhesive include rubber pressure-sensitive adhesives and acrylic pressure-sensitive adhesives containing addition polymerizable compounds having two or more unsaturated bonds, photopolymerizable compounds such as alkoxysilane having an epoxy group, and photopolymerization initiators such as carbonyl compounds, organic sulfur compounds, peroxides, amines, and onium salt compounds, that are disclosed in Japanese Patent Application Laid-Open No. 60-196956.

An example of a method of forming the portion 2a onto the pressure-sensitive adhesive layer 2 is a method of forming the ultraviolet ray curing-type pressure-sensitive adhesive layer 2 onto the base 1 and then curing by irradiating partially the portion 2a with ultraviolet ray. The partial ultraviolet ray irradiation can be performed through a photo mask in which a pattern corresponding to a portion 3b, etc. other than the semiconductor wafer pasting portion 3a is formed. Another example includes a method of curing by irradiating with ultraviolet ray in spot manner. The formation of the ultraviolet ray curing-type pressure-sensitive adhesive layer 2 can be performed by transferring the pressure-sensitive adhesive layer 2 provided on a separator onto the base 1. The partial ultraviolet ray irradiation can also be performed on the ultraviolet ray curing-type pressure-sensitive adhesive layer 2 provided on a separator.

In the pressure-sensitive adhesive layer 2 of the dicing die-bonding film 10, a part of the pressure-sensitive adhesive layer 2 may be irradiated with the ultraviolet ray so that the adhesive strength of the portion 2a becomes smaller than the adhesive strength of the other portion 2b. That is, the portion 2a can be formed where the adhesive strength is decreased by using the base 1 of which the entire or a part of the portion other than the portion corresponding to the semiconductor wafer pasting portion 3a of at least one side of the base 1 is shielded, forming the ultraviolet ray curing-type pressure-sensitive adhesive layer 2 onto the base 1, and then curing the portion corresponding to the semiconductor wafer pasting portion 3a by ultraviolet ray irradiation. A material that can be a photo mask on a support film can be manufactured by printing, vapor deposition, etc. as the shielding material. Accordingly, the dicing die-bonding film 10 of the present invention can be manufactured with good efficiency.

When an impediment to curing due to oxygen occurs during the ultraviolet ray irradiation, it is desirable to shut off oxygen (air) from the surface of the ultraviolet ray curing-type pressure-sensitive adhesive layer 2. Examples of the method include a method of coating the surface of the pressure-sensitive adhesive layer 2 with a separator and a method of performing the irradiation with the ultraviolet ray, and the like, in a nitrogen gas atmosphere.

The thickness of the pressure-sensitive adhesive layer 2 is not particularly limited. However, it is preferably about 1 to 50 μm from the respects of managing the prevention of breaking of the chip cut face and fixing and holding the adhesive layer at the same time, etc. It is more preferably 2 to 30 μm, and further preferably 5 to 25 μm. The pressure-sensitive adhesive layer 2 may be made of a single layer or may be made of a plurality of layers that are laminated.

The tensile storage modulus of the pressure-sensitive adhesive layer 2 at 23° C. and 150° C. is preferably $5 \times 10^4$ to $1 \times 10^{10}$ Pa, and more preferably $1 \times 10^5$ to $1 \times 10^8$ Pa. When the tensile storage modulus is less than $5 \times 10^4$ Pa, there is a case that peeling of the pressure-sensitive adhesive layer 2 and the die-bonding film 3,3' becomes difficult. On the other hand, when the tensile storage modulus exceeds $1 \times 10^{10}$ Pa, there is a case that the adhesion between the pressure-sensitive adhesive layer 2 and the die-bonding film 3,3' decreases. The tensile storage modulus of the pressure-sensitive adhesive layer 2 can be obtained as follows. That is, first, the pressure-sensitive adhesive layer is formed into a cylindrical shape with a thickness of about 1.5 mm and a diameter of 7.9 mm. Next, using an ARES viscoelastic measurement apparatus manufactured by Rheometric Scientific Co. as a dynamic viscoelastic measurement apparatus, each pressure-sensitive adhesive layer is installed on a parallel plate tool, and the temperature is changed at a rate of 5° C./min from 23° C. to 150° C. while applying a shearing strain at a frequency of 1 Hz. By measuring the modulus at this time, the tensile storage modulus at 23° C. and 150° C. can be obtained. When the pressure-sensitive adhesive layer 2 is a radiation curing type, the value of the tensile storage modulus is a value after the radiation curing. The tensile storage modulus can be appropriately adjusted by adding an external crosslinking agent, for example.

The surface free energy on the pasting surface of the pressure-sensitive adhesive layer 2 with the die-bonding film 3 is preferably 30 mJ/m² or less, more preferably 15 to 30 mJ/m², and particularly preferably 20 to 28 mJ/m². When the surface free energy exceeds 30 mJ/m², the tackiness of the pressure-sensitive adhesive layer 2 to the die-bonding film 3 becomes too large, and there is a case that the pickup property deteriorates. The surface free energy of the pressure-sensitive adhesive layer 2 can be appropriately adjusted by adding an external crosslinking agent, for example. The surface free energy can be calculated with the following method. That is, the contact angle (θ (rad)) is measured for the surface of each pressure-sensitive adhesive layer using water and methylene iodide. Next, the surface free energy ($\gamma_s$) is calculated with the following formula using this measured value and a known value from a document as the surface free energy value of a contact angle measurement liquid.

$$\gamma_s = \gamma_s^d + \gamma_s^p \tag{1}$$

$$\gamma_L = \gamma_L^d + \gamma_L^p \tag{2}$$

$$(1+\cos\theta)\gamma_L = 2(\gamma_s^d \gamma_L^d)^{1/2} + 2(\gamma_s^p \gamma_L^p)^{1/2} \tag{3}$$

However, each symbol in the formulas (1) to (3) represent as follows.

θ: Contact angle (rad) measured from drops of water or methylene iodide $\gamma_s$: Surface free energy of the pressure-sensitive adhesive layer 2 (mJ/m²)

$\gamma_s^d$: Dispersion component in the surface energy of the pressure-sensitive adhesive layer 2 (mJ/m²)

$\gamma_s^p$: Polar component in the surface energy of the pressure-sensitive adhesive layer 2 (mJ/m²)

$\gamma_L$: Surface free energy of water or methylene iodide (mJ/m²)

$\gamma_L^d$: Dispersion component in the surface energy of water or methylene iodide (mJ/m²)

$\gamma_L^p$: Polar component in the surface energy of water or methylene iodide (mJ/m²)

The value of the known surface free energy from a document is as follows.

Water: dispersion component ($\gamma_L^d$) 21.8 mJ/m², polar component ($\gamma_L^p$) 51.0 mJ/m²

Methylene iodide: dispersion component ($\gamma_L^d$) 49.5 mJ/m², polar component ($\gamma_L^p$) 1.3 mJ/m²

The measurement of the contact angle of water and methylene iodide at the pasting surface of the pressure-sensitive adhesive layer 2 with the die-bonding film 3 is a value obtained as follows. According to JIS Z8703, about 1 μL of drops of water (distilled water) or methylene iodide are dropped into the surface of the pressure-sensitive adhesive layer 2 under an environment of temperature 23±2° C. and relative humidity 50±5% RH. Next, using a surface contact angle meter "CA-X" (manufactured by FACE Co.), the contact angle is measured with a three point method (using an average value) at 30 seconds after the dropping.

Various additives such as a coloring agent, a thickening agent, an extender, a filler, a tackifier, a plasticizer, an anti-aging agent, an antioxidant, a surfactant, and a crosslinking agent may be included in the pressure-sensitive adhesive layer 2 within the range that the effect of the present invention is not damaged.

(Method for Manufacturing Dicing Die Bond Film)

Next, the method for manufacturing the dicing die-bonding film of the present invention is explained using the dicing die-bonding film 10 as an example. First, the base 1 can be formed with a conventionally known film formation method.

Examples of the film formation method include a calendar film formation method, a casting method in an organic solvent, an inflation extrusion method in a closed system, a T die extrusion method, a co-extrusion method, and a dry lamination method.

Next, the pressure-sensitive adhesive layer 2 is formed by applying the pressure-sensitive adhesive composition onto the base 1 and drying (by heat-crossing if necessary). Examples of the application method include roll coating, screen coating, and gravure coating. The coating may be performed directly onto the base 1, or the coating may be performed onto a peeling paper, etc. whose surface has undergone a peeling treatment.

On the other hand, a coating layer is formed by applying a forming material to form the die-bonding film 3 onto the peeling paper so as to become a prescribed thickness and then by drying under a prescribed condition. The die-bonding film 3 is formed by transferring this coating layer onto the pressure-sensitive adhesive layer 2. The die-bonding film 3 can also be formed by directly coating the forming material onto the pressure-sensitive adhesive layer 2 and then drying under a prescribed condition. Accordingly, the dicing die-bonding film 10 according to the present invention can be obtained.

(Method for Manufacturing Semiconductor Device)

Figure 3:
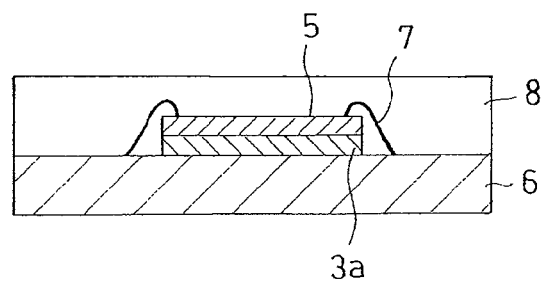
FIG. 3 is a schematic sectional view showing an example of mounting a semiconductor chip with the die-bonding film of one embodiment of the present invention.

Next, a method for manufacturing a semiconductor device using the die-bonding film according to the present embodiment is explained. FIG. 3 is a schematic sectional view showing an example of loading a semiconductor element with the die-bonding film.

The method for manufacturing a semiconductor device according to the present embodiment has a fixing step of fixing a semiconductor chip (semiconductor element) 5 onto the adherend 6 with a wafer pasting portion 3a of the die-bonding film 3 (referred to as a die-bonding film 3a below) interposed therebetween and a wire bonding step of wire bonding. It has a resin sealing step of sealing the semiconductor chip 5 with a sealing resin 8 and a post-curing step of after curing the sealing resin 8 as well.

The fixing step is a step of die bonding the semiconductor chip 5 to the adherend 6 with the die-bonding film 3a interposed therebetween as shown in FIG. 1. In this step, the die-bonding film 3a is heat-cured and the semiconductor chip 5 is completely adhered onto the adherend 6 by performing a heat treatment under a prescribed condition. The temperature when performing the heat treatment is preferably 100 to 200° C., and more preferably 120 to 180° C. The heat treatment time is preferably 0.25 to 10 hours, and more preferably 0.5 to 8 hours. An example of the method of fixing the semiconductor chip 5 onto the adherend 6 is a method of fixing by laminating the die-bonding film 3a onto the adherend 6 and then laminating the semiconductor chip 5 one by one on the die-bonding film 3a so that the wire bond surface becomes the upper side. The semiconductor chip 5 in which the die-bonding film 3a is fixed in advance may be fixed and laminated to the adherend 6.

The wire bonding step is a step of electrically connecting the tip of a terminal (inner lead) of the adherend 6 and an electrode pad (not shown) on the semiconductor chip 5 with a bonding wire 7. Examples of the bonding wire 7 include a gold wire, an aluminum wire, and a copper wire. The temperature when performing the wire bonding is 80 to 250° C., and preferably 80 to 220° C. The heating time is a few seconds to a few minutes. The wire connection is performed using vibrational energy due to ultrasonic waves and a bonding energy by applying pressure together while being heated to the temperature in the above-described range.

The resin sealing step is a step of sealing the semiconductor chip 5 with the sealing resin 8. The present step is performed to protect the semiconductor chip 5 that is loaded on the adherend 6 and the bonding wire 7. The present step is performed by molding the resin for sealing with a mold. An example of the sealing resin 8 is an epoxy resin. The heating temperature during the resin sealing is normally 175° C., and it is performed for 60 to 90 seconds. However, the present invention is not limited thereto, and the curing can be performed at 165 to 185° C. for a few minutes for example. Accordingly, the sealing resin is cured. In the present invention, voids between the die-bonding film 3a and the adherend 6 can be eliminated after the resin sealing step even when the heat treatment is performed to heat-cure the die-bonding film 3a in the die-bonding step.

In the post-curing step, the sealing resin 8 that is not sufficiently cured in the sealing step is completely cured. The heating temperature in the present step is in the range of 165 to 185° C., and the heating time is about 0.5 to 8 hours, for example, depending on the type of the sealing resin.

The semiconductor package that is obtained in such a manner has a high reliability that can withstand, for example, even when a humidity resistance solder reflow test is performed. The humidity resistance solder reflow test is performed with a conventionally known method.

Figure 4:
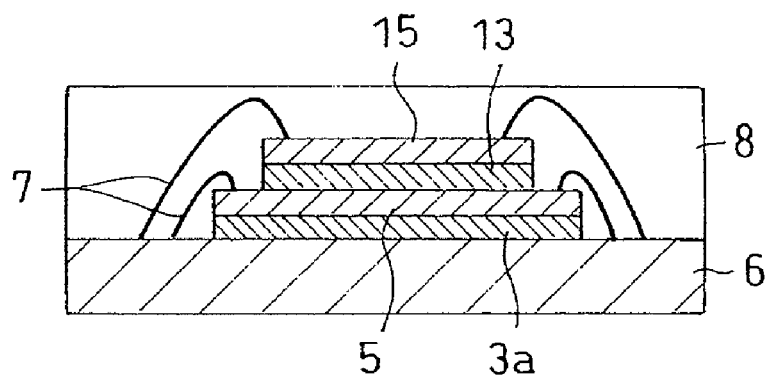
FIG. 4 is a schematic sectional view showing an example of three-dimensionally mounting a semiconductor chip with the die-bonding film.

The dicing die-bonding film of the invention also can be preferably used in the case of three-dimensional mounting also in which plural semiconductor chips are laminated, as illustrated in FIG. 4. FIG. 4 is a schematic sectional view illustrating an example wherein semiconductor chips are three-dimensionally mounted through a die-bonding film. In the case of the three-dimensional mounting illustrated in FIG. 4, at least one die-bonding film 3a cut out so as to have a size equal to that of a semiconductor chip 5 is bonded to the adherend 6, and then the semiconductor chip 5 is bonded onto the adherend 6 through the die-bonding film 3a so as to direct its wire bonding face upwards. Next, a die-bonding film 13 is bonded onto the semiconductor chip 5 avoiding its electrode pad portions. Furthermore, another semiconductor chip 15 is bonded onto the die-bonding film 13 so as to direct its wire bonding face upwards.

Next, a wire bonding step is performed. In this way, individual electrode pads on the semiconductor chip 5 and the other semiconductor chip 15 are electrically connected with the adherend 6 through bonding wires 7. In the case of the above-mentioned temporary bonding, the present step is carried out by way of no heating step.

Subsequently, a sealing step of sealing the semiconductor chip 5 and on the like with a sealing resin 8 is performed to cure the sealing resin. In addition thereto, in the case of the temporary sticking/fixing, the adherend 6 and the semiconductor chip 5 are bonded to each other through the die-bonding film 3a. Also, the semiconductor chip 5 and the other semiconductor chip 15 are bonded to each other through the die-bonding film 13. After the sealing step, an after-curing step may be performed.

In the case of the three-dimensional mounting of the semiconductor chips, the production process is simplified and the yield is improved since heating treatment by heating the die-bonding films 3a and 13 is not conducted. Furthermore, the adherend 6 is not warped, and the semiconductor chips 5 and 15 are not cracked; thus, the semiconductor element can be made still thinner.

Figure 5:
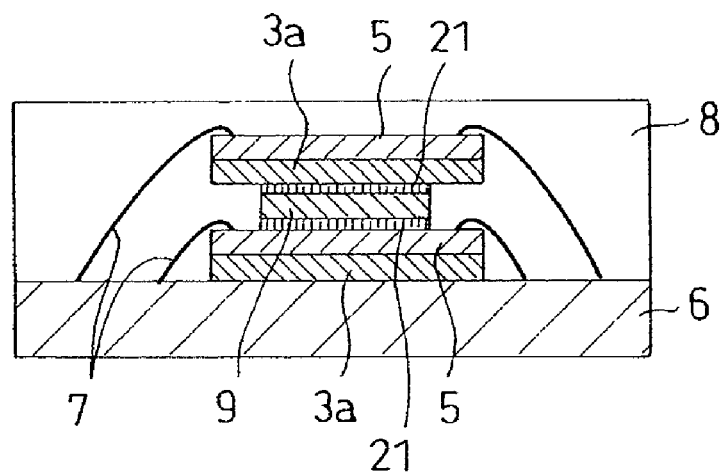
FIG. 5 is a schematic sectional view showing an example of three-dimensionally mounting two semiconductor chips with a spacer using the die-bonding film.

Three-dimensional mounting may performed in which semiconductor chips are laminated through die-bonding films so as to interpose a spacer between the semiconductor chips, as illustrated in FIG. 5. FIG. 5 is a schematic sectional view illustrating an example wherein two semiconductor chips are three-dimensionally mounted through die-bonding films so as to interpose a spacer between the chips.

In the case of the three-dimensional mounting illustrated in FIG. 5, first, a die-bonding film 3a, a semiconductor chip 5, and a die-bonding film 21 are successively laminated on a adherend 6 to bond these members. Furthermore, on the die-bonding film 21 are successively laminated a spacer 9, another die-bonding film 21, another die-bonding film 3a, and another semiconductor chip 5 to bond these members.

Next, as illustrated in FIG. 5, a wire bonding step is performed. In this way, electrode pads on the semiconductor chips 5 are electrically connected with the adherend 6 through bonding wires 7.

Subsequently, a sealing step of sealing the semiconductor chips 5 with a sealing resin 8 is performed to cure the sealing resin 8. In this way, a semiconductor package is obtained. The sealing step is preferably performed by a package sealing method wherein only the semiconductor chip 5 is sealed. The sealing is performed to protect the semiconductor chips 5 adhered onto the adhesive sheet(s). The method therefor is typically a method of using the sealing resin 8 and molding the resin 8 in a metal mold. At this time, it is general to use a metal mold composed of an upper metal mold part and a lower metal mold part and having plural cavities to seal simultaneously. The heating temperature at the time of the sealing preferably ranges, for example, from 170 to 180° C. After the sealing step, an after-curing step may be performed.

The spacer 9 is not particularly limited, and may be made of, for example, a silicone chip or polyimide film and the like known in the prior art. The spacer may be a core member. The core member is not particularly limited, and may be a core member known in the prior art. Specific examples thereof include films (such as a polyimide film, a polyester film, a polyethylene terephthalate film, a polyethylene naphthalate film, a polycarbonate film and the like), resin substrates each reinforced with glass fiber or plastic nonwoven fiber, mirror silicon wafers, silicon substrates, and glass substrates.

Next, the semiconductor package is surface-mounted on a printed wiring board. An example of a method of the surface mounting is reflow soldering in which solder is supplied onto the printed wiring board in advance and then heat-melted, and the soldering is performed. Examples of the heating method include hot air reflow and infrared ray reflow. It may be any method of entire heating or local heating. The heating temperature is preferably in the range of 240 to 265° C., and the heating time is preferably in the range of 1 to 20 seconds.

(Other Items)

When the semiconductor element is three-dimensionally mounted on the substrate, a buffer coat film is formed on the surface where a circuit of the semiconductor element is formed. Examples of the buffer coat film are a silicon nitride film and a film made of a heat resistant resin such as polyimide resin.

When the semiconductor element is three-dimensionally mounted, the die-bonding film used in each step is not limited to a die-bonding film made of the same composition, and it can be appropriately changed depending on manufacturing conditions, uses thereof, etc.

The above-described embodiment describes an aspect in which the wire bonding step is performed collectively after a plurality of semiconductor elements are laminated on the substrate, etc. However, the present invention is not limited thereto. For example, it is possible to perform the wire bonding step each time the semiconductor element is laminated onto the substrate, etc.

Preferred examples of this invention are explained in detail below. However, the materials, the blending amount, etc. described in these examples are not for the purpose of limiting the range of this invention only to these and they are simply examples for explanation. In these examples, "parts" means "parts by weight."

Example 1

An adhesive composition solution having a concentration of 23.6% by weight was obtained by dissolving 50 parts of an epoxy resin (trade name "EPPN501HY" having a melt viscosity of 0.7 Pa·s manufactured by Nippon Kayaku Co., Ltd.), 50 parts of a phenol resin (trade name "MEH7800" having a melt viscosity of 1.2 Pa·s manufactured by Meiwa Plastic Industries, Ltd.), 100 parts of an acrylic copolymer (trade name "REBITAL AR31" having a weight average molecular weight of 700,000 and a glass transition point at −15° C. manufactured by Nogawa Chemical Co., Ltd.), and 70 parts of spherical silica (trade name "S0-25R" having an average particle size of 0.5 μm manufactured by Admatechs Co., Ltd.) into methylethylketone.

This adhesive composition solution was applied onto a releasing treatment film (a peeling liner) made of a polyethylene terephthalate film having a thickness of 50 μm on which a silicone releasing treatment was performed, and it was dried at 130° C. for 2 minutes. Accordingly, a thermosetting die-bonding film having a thickness of 25 μm was produced.

Example 2

An adhesive composition solution having a concentration of 23.6% by weight was obtained by dissolving 120 parts of an epoxy resin (trade name "EPPN501HY" having melt viscosity of 0.7 Pa·s manufactured by Nippon Kayaku Co., Ltd.), 120 parts of a phenol resin (trade name "MEH7800" having a melt viscosity of 1.2 Pa·s manufactured by Meiwa Plastic Industries, Ltd.), 100 parts of an acrylic copolymer (trade name "REBITAL AR31" having a weight average molecular weight of 700,000 and a glass transition point at −15° C. manufactured by Nogawa Chemical Co., Ltd.), 0.5 parts of a curing catalyst (trade name "TPP-K" manufactured by Hokko Chemical Industry Co., Ltd.), and 70 parts of spherical silica (trade name "S0-25R" having an average particle size of 0.5 μm manufactured by Admatechs Co., Ltd.) into methylethylketone.

This adhesive composition solution was applied onto a releasing treatment film (a peeling liner) made of a polyethylene terephthalate film having a thickness of 50 μm on which a silicone releasing treatment was performed, and it was dried at 130° C. for 2 minutes. Accordingly, a thermosetting die-bonding film having a thickness of 25 μm was produced.

Example 3

An adhesive composition solution having a concentration of 23.6% by weight was obtained by dissolving 145 parts of an epoxy resin (trade name "EPPN501HY" having a melt viscosity of 0.7 Pa·s manufactured by Nippon Kayaku Co., Ltd.), 145 parts of a phenol resin (trade name "MEH7800" having a melt viscosity of 1.2 Pa·s manufactured by Meiwa Plastic Industries, Ltd.), 100 parts of an acrylic copolymer (trade name "REBITAL AR31" having a weight average molecular weight of 700,000 and a glass transition point at −15° C. manufactured by Nogawa Chemical Co., Ltd.), 0.5 parts of a curing catalyst (trade name "TPP-K" manufactured by Hokko Chemical Industry Co., Ltd.), and 70 parts of spherical silica (trade name "SO-25R" having an average particle size of 0.5 μm manufactured by Admatechs Co., Ltd.) into methylethylketone.

This adhesive composition solution was applied onto a releasing treatment film (a peeling liner) made of a polyethylene terephthalate film having a thickness of 50 μm on which a silicone releasing treatment was performed, and it was dried at 130° C. for 2 minutes. Accordingly, a thermosetting die-bonding film having a thickness of 25 μm was produced.

Comparative Example 1

An adhesive composition solution having a concentration of 23.6% by weight was obtained by dissolving 33 parts of an epoxy resin (trade name "EPICOAT 1001" having a melt viscosity of 1.5 Pa·s manufactured by Japan Epoxy Resins Co., Ltd.), 33 parts of a phenol resin (trade name "MEH7851" having a melt viscosity of 3.4 Pa·s manufactured by Meiwa Plastic Industries, Ltd.), 100 parts of an acrylic copolymer (trade name "REBITAL AR31" having a weight average molecular weight of 700,000 and a glass transition point at −15° C. manufactured by Nogawa Chemical Co., Ltd.), and 58 parts of spherical silica (trade name "SO-25R" having an average particle size of 0.5 μm manufactured by Admatechs Co., Ltd.) into methylethylketone.

This adhesive composition solution was applied onto a releasing treatment film (a peeling liner) made of a polyethylene terephthalate film having a thickness of 50 μm on which a silicone releasing treatment was performed, and it was dried at 130° C. for 2 minutes. Accordingly, a thermosetting die-bonding film having a thickness of 25 μm was produced.

Comparative Example 2

An adhesive composition solution having a concentration of 23.6% by weight was obtained by dissolving 13 parts of an epoxy resin (trade name "EPICOAT 1001" having a melt viscosity of 1.5 Pa·s manufactured by Japan Epoxy Resins Co., Ltd.), 13 parts of a phenol resin (trade name "MEH7851" having a melt viscosity of 3.4 Pa·s manufactured by Meiwa Plastic Industries, Ltd.), 100 parts of an acrylic copolymer (trade name "REBITAL AR31" having a weight average molecular weight of 700,000 and a glass transition point at −15° C. manufactured by Nogawa Chemical Co., Ltd.), and 75 parts of spherical silica (trade name "SO-25R" having an average particle size of 0.5 μm manufactured by Admatechs Co., Ltd.) into methylethylketone.

This adhesive composition solution was applied onto a releasing treatment film (a peeling liner) made of a polyethylene terephthalate film having a thickness of 50 μm on which a silicone releasing treatment was performed, and it was dried at 130° C. for 2 minutes. Accordingly, a thermosetting die-bonding film having a thickness of 25 μm was produced.

(Method of Measuring Weight Average Molecular Weight)

The weight average molecular weight of the acrylic copolymer containing a carbonxyl group is a polyetyrene converted value obtained by gel permeation chromatography. The gel permeation chromatography was performed using four columns of TSK G200H HR, G3000H HR, G4000H HR, and GMH-H HR manufactured by Tosoh Cooperation that are connected in series, by using teterahydrofuran as an eluent, in a condition of a flow rate of 1 ml/min, a temperature of 40° C., a concentration of a tetrahydrofuran solution as a sample of 0.1% by weight, and a sample injection amount of 500 μl, and by using a differential refractometer as a detector.

(Measurement of Melt Viscosity)

The melt viscosity at 120 to 130° C. was measured for each of the thermosetting die-bonding films that were produced. That is, the die-bonding film was laminated to a thickness of 2 mm. Next, it was cut out into 8 mm diameter pieces, and the average value of the melt viscosity at 120 to 130° C. was obtained by measuring the melt viscosity from 50 to 150° C. at a temperature rate of 10° C./min and a frequency of 1 MHz using a solid viscoelastic measurement apparatus (ARES manufactured by Rheometric Scientific Co.). The result is shown in Table 1 below.

The average values of the melt viscosities of the epoxy resin and the phenol resin at 120 to 130° C. were obtained by measuring the melt viscosities from 50 to 150° C. of these resins at a temperature rate of 10° C./min and a frequency of 1 MHz using a solid viscoelastic measurement apparatus (ARES manufactured by Rheometric Scientific Co.).

(Confirmation of Micro Voids Generation)

Each of the thermosetting die-bonding films that were produced was pasted onto a 10 mm square semiconductor chip having a thickness of 75 μm under a condition of a temperature of 40° C. Then, the semiconductor chip was mounted onto a BGA substrate with each die-bonding film interposed therebetween. The mounting condition was a temperature of 120° C. and a pressure of 0.1 MPa for 1 second.

Next, the BGA substrate on which the semiconductor chip was mounted was thermally treated in a dryer at 150° C. for 1 hour, and then it was packaged with a sealing resin (trade name "GE-100" manufactured by Nitto Denko Corporation). The sealing condition was a heating temperature of 175° C. for 180 seconds.

Then, the sealed semiconductor device was cut with a glass cutter, and the number of micro voids was counted by observing the peripheral part of the semiconductor chip (the frame-like region 0.5 mm wide) with an infrared microscope.

(Humidity Resistance Solder Reflow Property)

Each of the thermosetting die-bonding films that were produced was pasted onto a 10 mm square semiconductor chip having a thickness of 75 μm under a condition of a temperature of 40° C. Then, the semiconductor chip was mounted onto a BGA substrate with each die-bonding film interposed therebetween. The mounting condition was a temperature of 120° C. and a pressure of 0.1 MPa for 1 second.

Next, the BGA substrate on which the semiconductor chip was mounted was thermally treated in a dryer at 150° C. for 1 hour, and then it was packaged with a sealing resin (trade name "GE-100" manufactured by Nitto Denko Corporation). The sealing condition was a heating temperature of 175° C. for 180 seconds.

Then, absorption of humidity was performed under a condition of 60° C., 80% RH, and 168 hours, and the BGA substrate on which the semiconductor chip was mounted was loaded into an IR reflow furnace that was set to maintain 260° C. or more for 10 seconds. Then, the sealed semiconductor device was cut with a glass cutter, and whether there was peeling or not at the interface of each of the thermosetting die-bonding films and the BGA substrate was confirmed by observing its cross section with a supersonic microscope. The confirmation was performed for 20 semiconductor chips, the case that there is one or fewer semiconductor chips where peeling is occurring is marked as O, and the case there are one or more semiconductor chips where peeling is occurring is marked as x. The result is shown in Table 1 below.

(Measurement of Glass Transition Point ($T_g$))

The glass transition point of the acrylic copolymer that was used in each example and comparative example was measured from tan (G" (loss modulus)/G' (storage modulus)) at a temperature rate of 10° C./min and a frequency of 1 MHz using a viscoelastic measurement apparatus (ARES manufactured by Rheometric Scientific Co.).

(Results)

As found from the results in Table 1, when the ratio (X/Y) of the total content of the epoxy resin and the phenol resin to the content of the acrylic copolymer is less than 0.7 as in Comparative Examples 1 and 2, it was confirmed that a large number of micro voids was generated at the peripheral part of the semiconductor chip. For the humidity resistance reflow property, it was confirmed that peeling occurs between the thermosetting die-bonding film and the BGA substrate.

Contrary to this, when the X/Y is 0.7 or more as in Examples 1 and 2, the micro voids did not occur at the peripheral part of the semiconductor chip at all. It was also confirmed that peeling did not occur between the thermosetting die-bonding film and the BGA substrate, and the humidity resistance reflow property was excellent.

|  | Example 1 | Example 2 | Example 3 | Comparative Example 1 | Comparative Example 2 |
|---|---|---|---|---|---|
| X/y (—) | 1 | 2.4 | 2.9 | 0.66 | 0.26 |
| MELT VISCOSITY AT 120 TO 130° C. (Pa·s) | 2928 | 2045 | 505 | 3592 | 46355 |
| NUMBER OF GENERATED MICRO VOIDS | 0 | 0 | 0 | 304 | 684 |
| HUMIDITY RESISTANCE SOLDER REFLOW PROPERTY | ○ | ○ | ○ | X | X |

In the table, X (parts by weight) represents the total weight of the epoxy resin and the phenol resin, and Y (parts by weight) represents the weight of the acrylic copolymer.

What is claimed is:

1. A thermosetting die-bonding film that is used in manufacturing a semiconductor device,
    comprising at least an epoxy resin, a phenol resin, and an acrylic copolymer, which are characterized by a ratio X/Y is 2.4 to 5, where X represents a total weight of the epoxy resin and the phenol resin, and where Y represents a weight of the acrylic copolymer.

2. The thermosetting die-bonding film according to claim 1, wherein the epoxy resin is further characterized as having a melt viscosity at 120 to 130° C. in the range of 0.05 to 7 Pa·s.

3. The thermosetting die-bonding film according to claim 1, wherein the phenol resin is further characterized as having a melt viscosity at 120 to 130° C. in the range of 0.3 to 35 Pa·s.

4. The thermosetting die-bonding film according to claim 1, wherein the acrylic copolymer comprises 10 to 60% by weight of butyl acrylate and 40 to 90% by weight of ethyl acrylate.

5. The thermosetting die-bonding film according to claim 1, wherein the thermosetting die-bonding film is further characterized as having a melt viscosity at 120 to 130° C. a in the range of 500 to 3500 Pa·s.

6. The thermosetting die-bonding film according to claim 1, wherein the acrylic copolymer is further characterized in having a glass transition point in the range of −30 to 30° C.

7. A dicing die-bondin film having a structure in which the thermosetting die-bonding film according to claim 1 is laminated on a dicing film.

8. The dicing die-bonding film according to claim 7, wherein the dicing film comprises a base, a pressure-sensitive adhesive layer laminated on the base via a base-attaching surface of the pressure-sensitive adhesive layer, and the dicing die-bonding film laminated on a surface of the pressure-sensitive adhesive layer opposite to the base-attaching surface of the pressure-sensitive adhesive layer.

9. The thermosetting die-bonding film according to claim 1, wherein a blend ratio between the phenol resin and the epoxy resin is from 0.5 to 2.0 equivalents of hydroxyl groups in the phenol resin per equivalent of epoxy groups in the epoxy resin component.

10. The thermosetting die-bonding film according to claim 1, wherein a weight average molecular weight of the acrylic copolymer is from 100,000 to 1,200,000.

11. A method of manufacturing a semiconductor device, comprising:
    providing the thermosetting die-bonding film of claim 1;
    fixing a semiconductor chip to an adherent with the thermosetting die-bonding film interposed therebetween;
    electrically connecting a tip of a terminal of the adherent and an electrode pad on the semiconductor chip with a bonding wire; and
    sealing the semiconductor chip with a sealing resin.

* * * * *

UNITED STATES PATENT AND TRADEMARK OFFICE
CERTIFICATE OF CORRECTION

| | |
|---|---|
| PATENT NO. | : 8,143,106 B2 |
| APPLICATION NO. | : 12/549739 |
| DATED | : March 27, 2012 |
| INVENTOR(S) | : Yuki Sugo et al. |

It is certified that error appears in the above-identified patent and that said Letters Patent is hereby corrected as shown below:

At Column 4, Line 16 (Approx.), please change "tris-glycicylisocyanurate" to --tris-glycidylisocyanurate--.

At Column 4, Line 31 (Approx.), please change "polyoxystryrene" to --polyoxystyrene--.

At Column 5, Line 36, please change "thicotropic" to --thixotropic--.

At Column 8, Line 61, please change "acylic" to --acrylic--.

At Column 9, Line 64, please change "8-hydorxyoctyl" to --8-hydroxyoctyl--.

At Column 10, Line 17, please change "methacylate," to --methacrylate,--.

At Column 10, Line 24-25, please change "(meth)acryloyloxynaphtalene" to --(meth)acryloyloxynaphthalene--.

At Column 10, Line 31, please change "acrylnitrile." to --acrylonitrile.--.

At Column 12, Line 5, please change "mathacryloyl" to --methacryloyl--.

At Column 12, Line 9, please change "4-hydroxybityl" to --4-hydroxybutyl--.

At Column 12, Line 33-34, please change "beozoin" to --benzoin--.

At Column 12, Line 40, please Change "3,3'-dimethl-4-methoxybenzophenone;" to --3,3'-dimethyl-4-methoxybenzophenone;--.

At Column 19, Line 58, please change "carbonxyl" to --carboxyl--.

At Column 19, Line 58, please change "polyetyrene" to --polystyrene--.

At Column 19, Line 63, please change "teterahydrofuran" to --tetrahydrofuran--.

At Column 22, Line 13, In Claim 5, please change "a in" to --in--.

At Column 22, Line 18, In Claim 7, please change "die-bondin" to --die-bonding--.

Signed and Sealed this
Eleventh Day of September, 2012

David J. Kappos
*Director of the United States Patent and Trademark Office*